US012696429B2

(12) United States Patent
Chen

(10) Patent No.: US 12,696,429 B2
(45) Date of Patent: Jul. 28, 2026

(54) POWER SUPPLY DEVICE

(71) Applicant: LITE-ON TECHNOLOGY CORPORATION, Taipei (TW)

(72) Inventor: Yung-Hsiang Chen, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 267 days.

(21) Appl. No.: 18/760,060

(22) Filed: Jul. 1, 2024

(65) Prior Publication Data

US 2025/0358985 A1 Nov. 20, 2025

(30) Foreign Application Priority Data

May 17, 2024 (CN) .......................... 202410615262.2

(51) Int. Cl.
*H05K 7/20* (2006.01)
*H05K 5/02* (2006.01)
*H05K 7/14* (2006.01)

(52) U.S. Cl.
CPC ....... *H05K 7/20909* (2013.01); *H05K 5/0213* (2013.01); *H05K 7/1427* (2013.01)

(58) Field of Classification Search
CPC .. G06F 1/20; G06F 1/26; G06F 1/206; H05K 7/20909; H05K 7/209; H05K 2201/064; F28F 3/12; H02B 1/56
See application file for complete search history.

(56) References Cited

U.S. PATENT DOCUMENTS

| | | | | |
|---|---|---|---|---|
| 2021/0176900 A1* | 6/2021 | Zhu | ................... | H05K 7/20272 |
| 2025/0081417 A1* | 3/2025 | Lee | ................... | H05K 7/20336 |
| 2025/0275104 A1* | 8/2025 | Onaga | ................... | H05K 7/209 |

FOREIGN PATENT DOCUMENTS

| | | |
|---|---|---|
| CN | 110505786 A | 11/2019 |
| CN | 211090131 U | 7/2020 |
| CN | 216383792 U | 4/2022 |
| CN | 216927556 U | 7/2022 |

OTHER PUBLICATIONS

Office Action issued by Taiwan Intellectual Property Office on Nov. 25, 2024.

* cited by examiner

*Primary Examiner* — Mandeep S Buttar
(74) *Attorney, Agent, or Firm* — WPAT, PC

(57) ABSTRACT

A power supply device is provided. The power supply device comprises a casing, a circuit board module, thermally conductive glue, a thermally conductive plate and a plurality of ventilation pipes. The circuit board module is arranged in the casing. The thermally conductive glue is disposed under the circuit board module and is filled in the bottom of the casing. The thermally conductive plate is disposed below the circuit board module and is embedded in the thermally conductive glue. The plurality of ventilation pipes are disposed on the thermally conductive plate and are embedded in the thermally conductive glue. Each of the ventilation pipes has openings at two ends thereof.

17 Claims, 9 Drawing Sheets

POWER SUPPLY DEVICE

This application claims the benefits of the PRC application Serial No. 202410615262.2 filed May 17, 2024, the disclosure of which is incorporated by reference herein in its entirety.

TECHNICAL FIELD

The present disclosure relates to a power supply device, and in particular relates to a power supply device with an enhanced configuration for thermal dissipation.

BACKGROUND

The current cooling method for a power supply unit is to provide ventilation openings on both sides of a casing of the power supply unit. Airflow is introduced from one side to take away the heat generated by internal components of the power supply unit and then expelled from the other side of the casing, thereby cooling the power supply unit. However, this cooling method only focuses on temperature reduction of the internal components themselves, but does not consider the heat dissipation of through-hole packaged components' exposed pins inserted into a circuit board.

In view of this, those skilled in the art are dedicated to solve the aforementioned problem.

SUMMARY

According to one aspect of the present disclosure, a power supply device is provided. The power supply device comprises a casing, a circuit board module, thermally conductive glue, a thermally conductive plate and a plurality of ventilation pipes. The circuit board module is arranged in the casing. The thermally conductive glue is disposed under the circuit board module and is filled in the bottom of the casing. The thermally conductive plate is disposed below the circuit board module and is embedded in the thermally conductive glue. The plurality of ventilation pipes are disposed on the thermally conductive plate and are embedded in the thermally conductive glue. Each of the ventilation pipes has openings at two ends thereof.

The above summary is not intended to represent all embodiments or all aspects of the present disclosure. Rather, the foregoing summary merely provides examples that illustrate the novel aspects and features of the present disclosure. The above and other aspects of the present disclosure will become better understood with regard to the following detailed description of the preferred but non-limiting embodiment(s). The following description is made with reference to the accompanying drawings.

BRIEF DESCRIPTION OF THE DRAWINGS

The following figures are merely illustrative of embodiments and are not intended to limit the scope of embodiments or claims.

DETAILED DESCRIPTION

Figure 1:
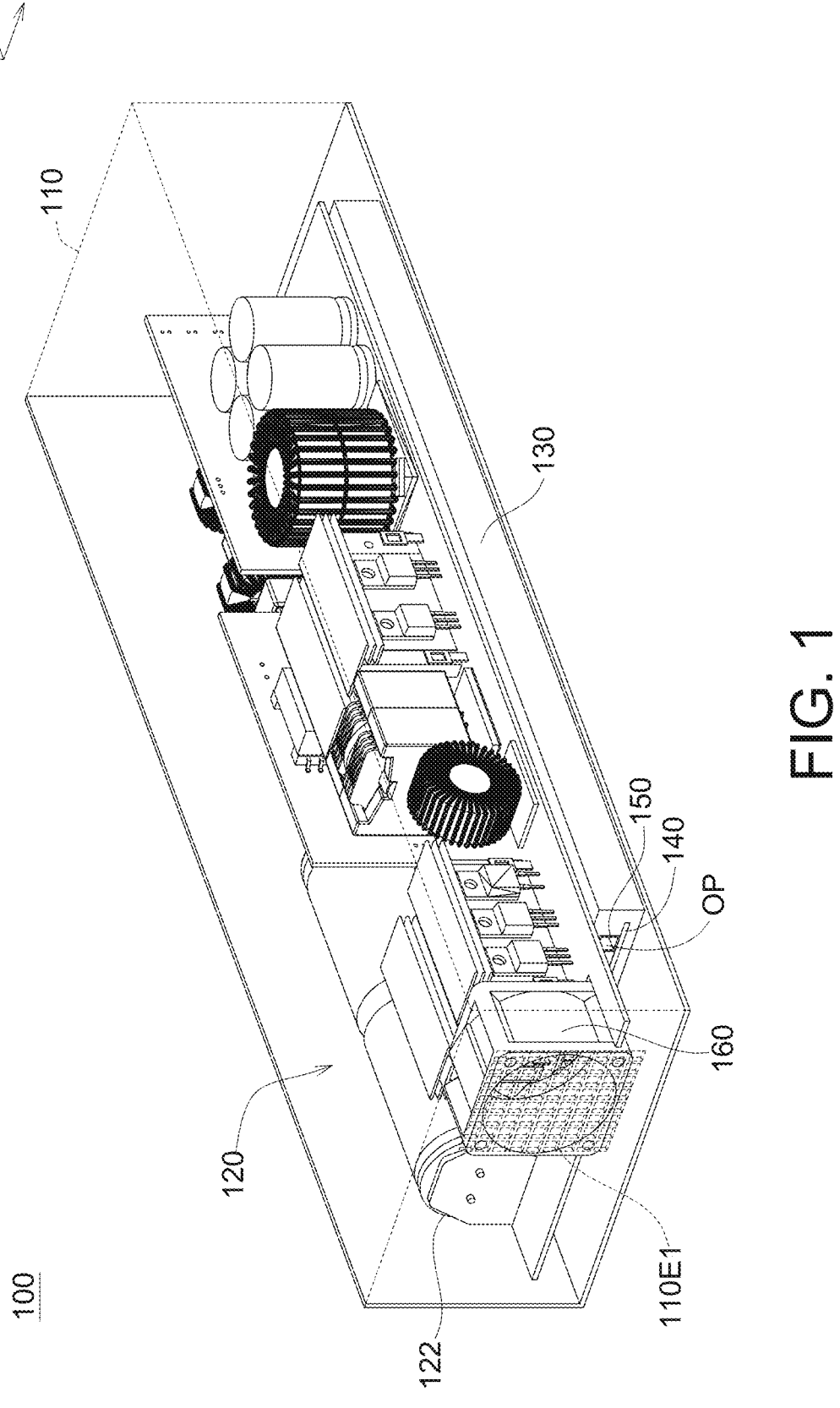
FIG. 1 is a schematic stereogram of a power supply device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the description of the specification, many specific details are provided to give the reader a more comprehensive understanding of the present disclosure; however, the present disclosure can still be practiced without some or all of these specific details. Additionally, well-known common steps or components are not described in detail to avoid unnecessarily limiting the present disclosure. The same or similar elements in the figures are represented by the same or similar sign. It should be noted that the figures are for illustrative purposes only and do not represent the actual size or quantity of the elements unless specifically stated otherwise.

Figure 2:
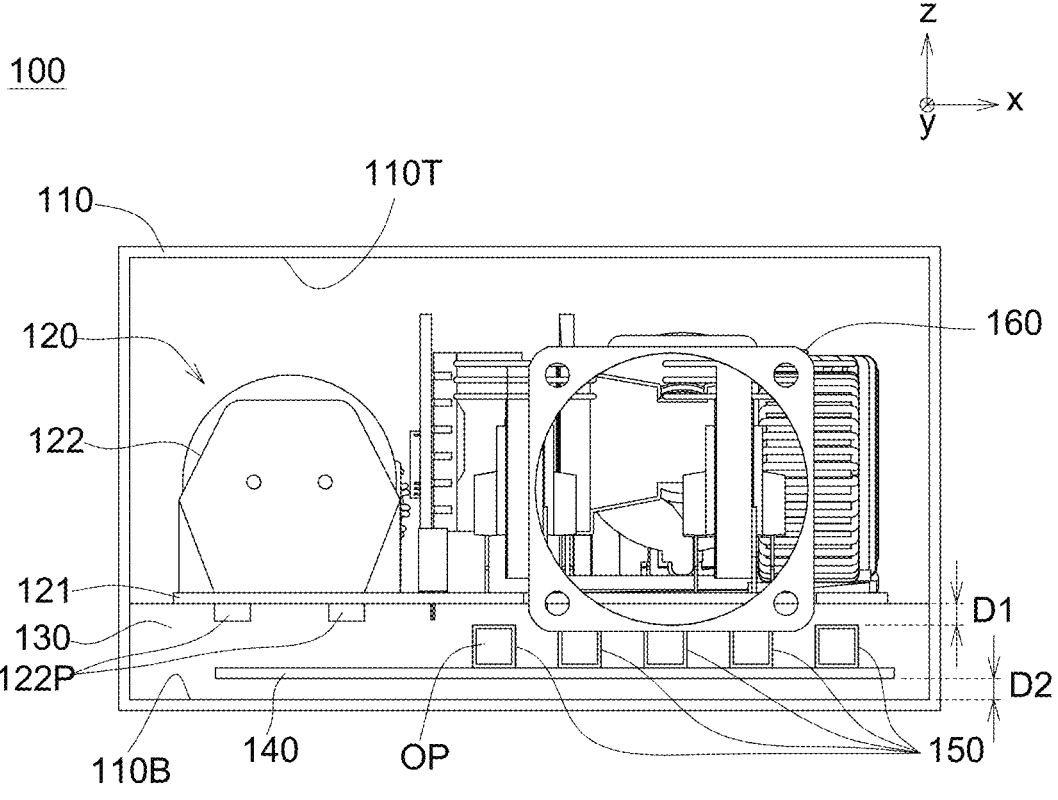
FIG. 2 is a front view of a power supply device according to an embodiment of the present disclosure.
Figure 3:
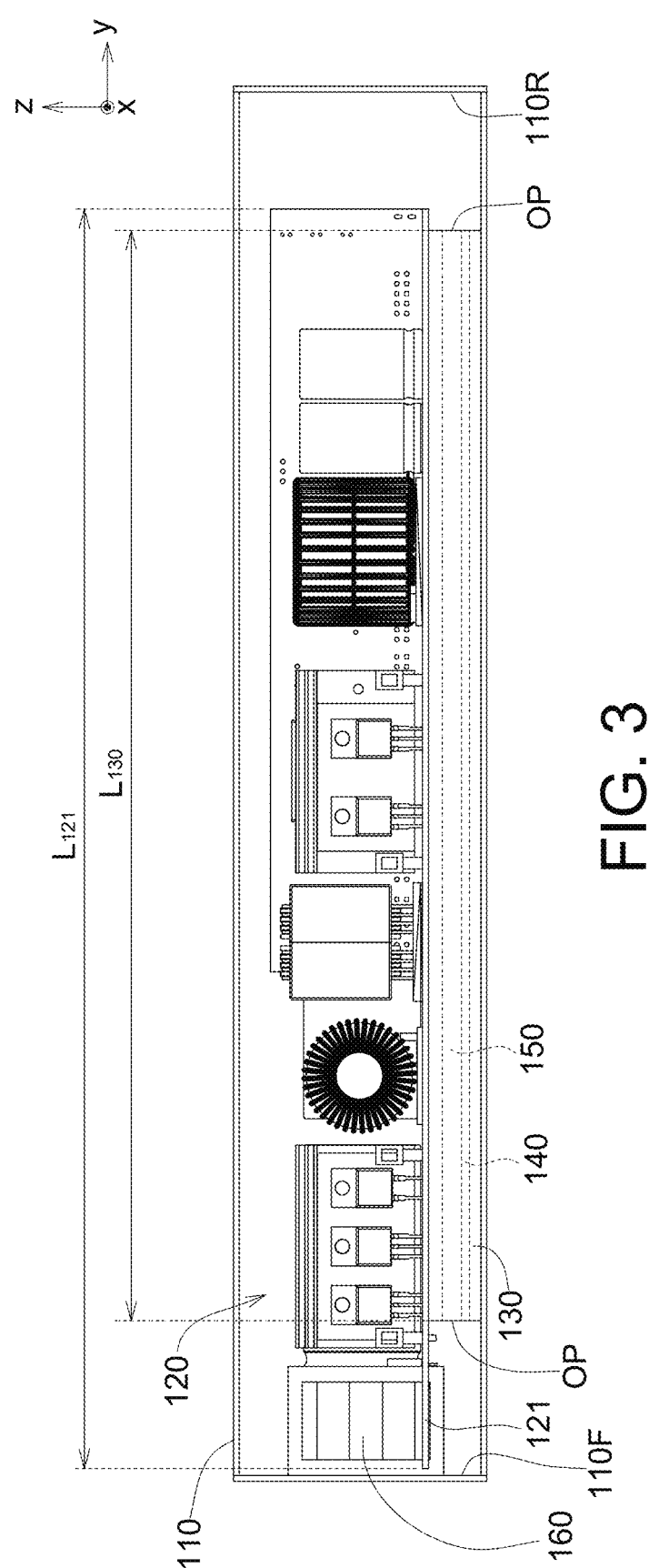
FIG. 3 is a side view of a power supply device according to an embodiment of the present disclosure.

Please refer to FIGS. 1-3. FIG. 1 is a schematic stereogram of a power supply device 100 according to an embodiment of the present disclosure, FIG. 2 is a front view of the power supply device 100, and FIG. 3 is a side view of the power supply device 100.

The power supply device 100, for example, is a power supply unit (PSU) used in computing servers, with a power rating of up to 3.2 kW, hence requiring corresponding heat dissipation measures. The power supply device 100 may comprise a casing 110, a circuit board module 120, thermally conductive glue 130, a thermally conductive plate 140, and a plurality of ventilation pipes 150. The casing 110 is not completely enclosed and may have an inlet and an outlet (i.e., the inlet 110E1 and the outlet 110E2 as shown in FIGS. 4A-4F) to facilitate heat dissipation of internal components through heat convection. The circuit board module 120, thermally conductive glue 130, the thermally conductive plate 140, and the ventilation pipes 150 are all positioned inside the casing 110. The thermally conductive glue 130 is disposed under the circuit board module 120 and fills the bottom of the casing 110. For example, the thermally conductive glue 130 may be selected from organic silicone grease encapsulant, epoxy resin encapsulant, or polyurethane encapsulant. The thermally conductive plate 140 is positioned below the circuit board module 120 and embedded in the thermally conductive glue 130. For example, the thermally conductive plate 140 may be formed of metal material, such as but not limited to an aluminum sheet, to provide better thermal conductivity. A plurality of ventilation pipes 150 are in contact with the thermally conductive plate 140 and embedded in the thermally conductive glue 130. Specifically, each end of the ventilation pipes 150 has an opening OP to allow airflow to circulate inside and take away heat. For example, the ventilation pipes 150 may be aluminum or ceramic pipes to provide better thermal conductivity.

The power supply device 100 may also comprise a fan module 160. The fan module 160 is disposed in the casing 110. The fan module 160 is positioned on a front side of the ventilation pipes 150, i.e., near the inlet 110E1 of the power supply device 100. The fan module 160 facilitates forced convection to cool the electronic components on the circuit board module 120 by blowing air, and expels heat through the outlet 110E2 of the power supply device 100. For example, the circuit board module 120 may comprise a circuit board 121 and at least one electronic component 122. The thermally conductive glue 130 is disposed under the circuit board 121, and the electronic component 122 is mounted on the circuit board 121 with a through-hole insertion. Specifically, the electronic component 122 is a dual in-line package (DIP) component, and its pins 122P are embedded in the thermally conductive glue 130.

It should be understood that the circuit board 121 of the circuit board module 120 may be equipped with a plurality of dual in-line package-type components like the electronic component 122, and the pins of these dual in-line package-type components may also be embedded in the thermally conductive glue 130. Therefore, the thermally conductive glue 130 can absorb heat from these dual in-line package-type components on the circuit board 121 through contact with their pins, and then transfer the heat to the embedded ventilation pipes 150. In addition, the thermally conductive plate 140 embedded in the thermally conductive glue 130 can also absorb the heat from the thermally conductive glue 130 and transfer the heat to the ventilation pipes 150 that the thermally conductive plate 140 is in contact with. Subsequently, the airflow generated by the fan module 160 can pass the ventilation pipes 150 through the openings OP, thereby taking away the heat transferred from the thermally conductive glue 130 and the thermally conductive plate 140 to the ventilation pipes 150. As such, an enhanced heat dissipation effect for the pins of the dual in-line package-type components can be provided.

In this embodiment, the ventilation pipes 150 are disposed above the thermally conductive plate 140, i.e., on an upper surface of the thermally conductive plate 140. Furthermore, in this embodiment, the ventilation pipes 150 are spaced apart and disposed above the thermally conductive plate 140. In other embodiments, the ventilation pipes 150 may also be disposed below the thermally conductive plate 140, i.e., on a lower surface of the thermally conductive plate 140, as long as the condition of contact between the ventilation pipes 150 and the thermally conductive plate 140 is met. In this embodiment, there is a distance D1 between the ventilation pipes 150 and the circuit board 121 to avoid interference between the pins of the dual in-line package-type components and the ventilation pipes 150. In this embodiment, the ventilation pipes 150 are straight pipes, and their openings OP are square-shaped. However, in other embodiments, the ventilation pipes 150 may also be curved pipes, and their openings OP may be circular-shaped.

In this embodiment, there is a distance D2 between the thermally conductive plate 140 and a bottom wall 110B of the casing 110, so that the thermally conductive plate 140 is encapsulated by the thermally conductive glue 130 both above and below, thereby enhancing the heat absorption effect of the thermally conductive plate 140 on the thermally conductive glue 130. In this embodiment, as shown in the side view in FIG. 3, there is space between the thermally conductive glue 130 and a front wall 110F, and there is another space between the thermally conductive glue 130 and a rear wall 110R of the casing 110, i.e., the thermally conductive glue 130 does not completely fill the entire bottom of the casing 110, to preserve space for the airflow inlet and outlet of the power supply device 100. Furthermore, in this embodiment, as shown in the side view in FIG. 3, a length $L_{121}$ of the circuit board 121 is greater than a length $L_{130}$ of the thermally conductive glue 130, so that a portion of the circuit board 121 protruding from the front side of the thermally conductive glue 130 can provide a location for the fan module 160 to dispose.

Please refer to FIGS. 4A-4F, which illustrate schematic diagrams of a manufacturing process of the power supply device 100. The method of forming the power supply device 100 is described below in conjunction with FIGS. 4A-4F.

Figure 4A:
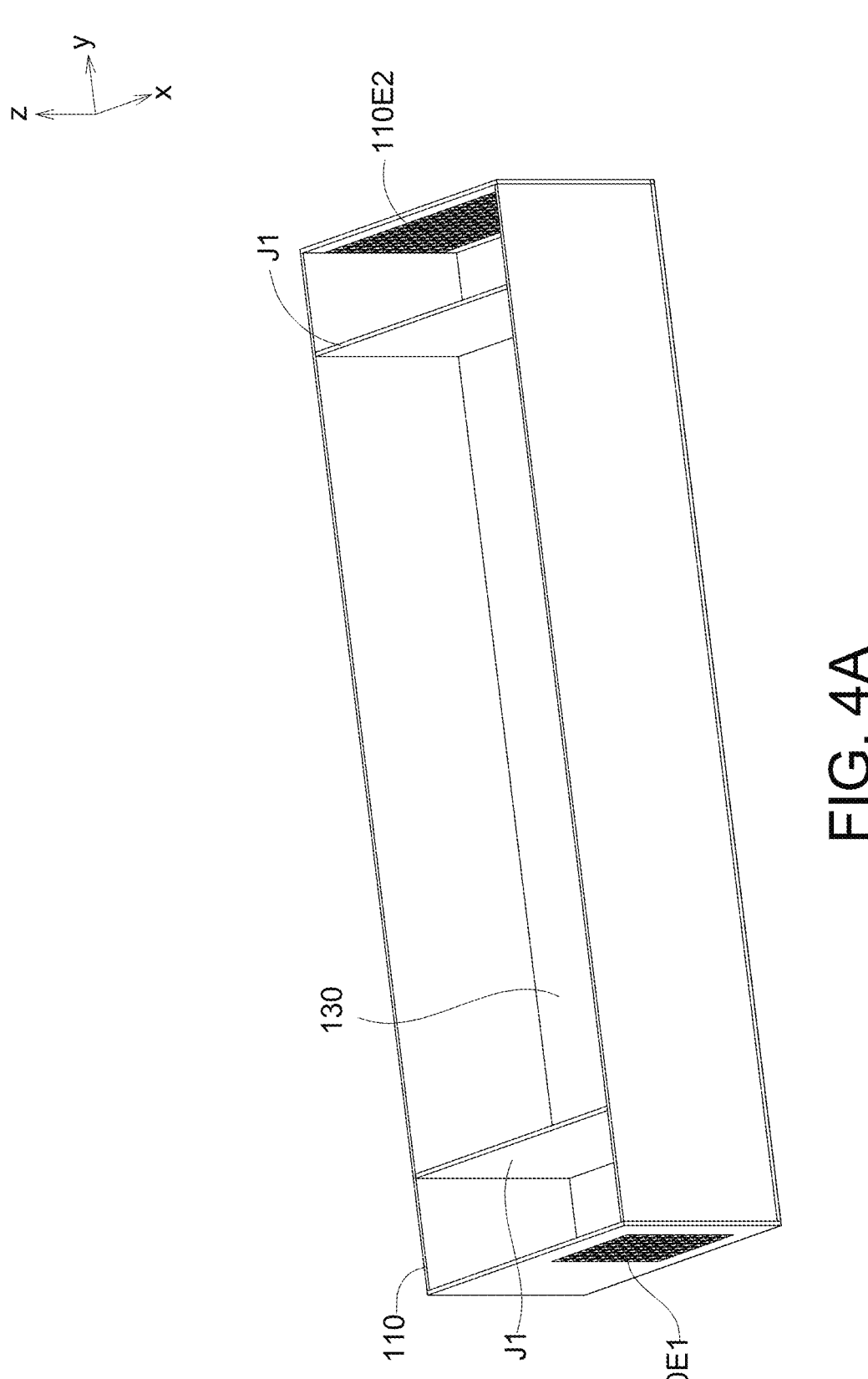
FIG. 4A to FIG. 4F are schematic diagrams of a manufacturing process of a power supply device according to an embodiment of the present disclosure.
Figure 4B:
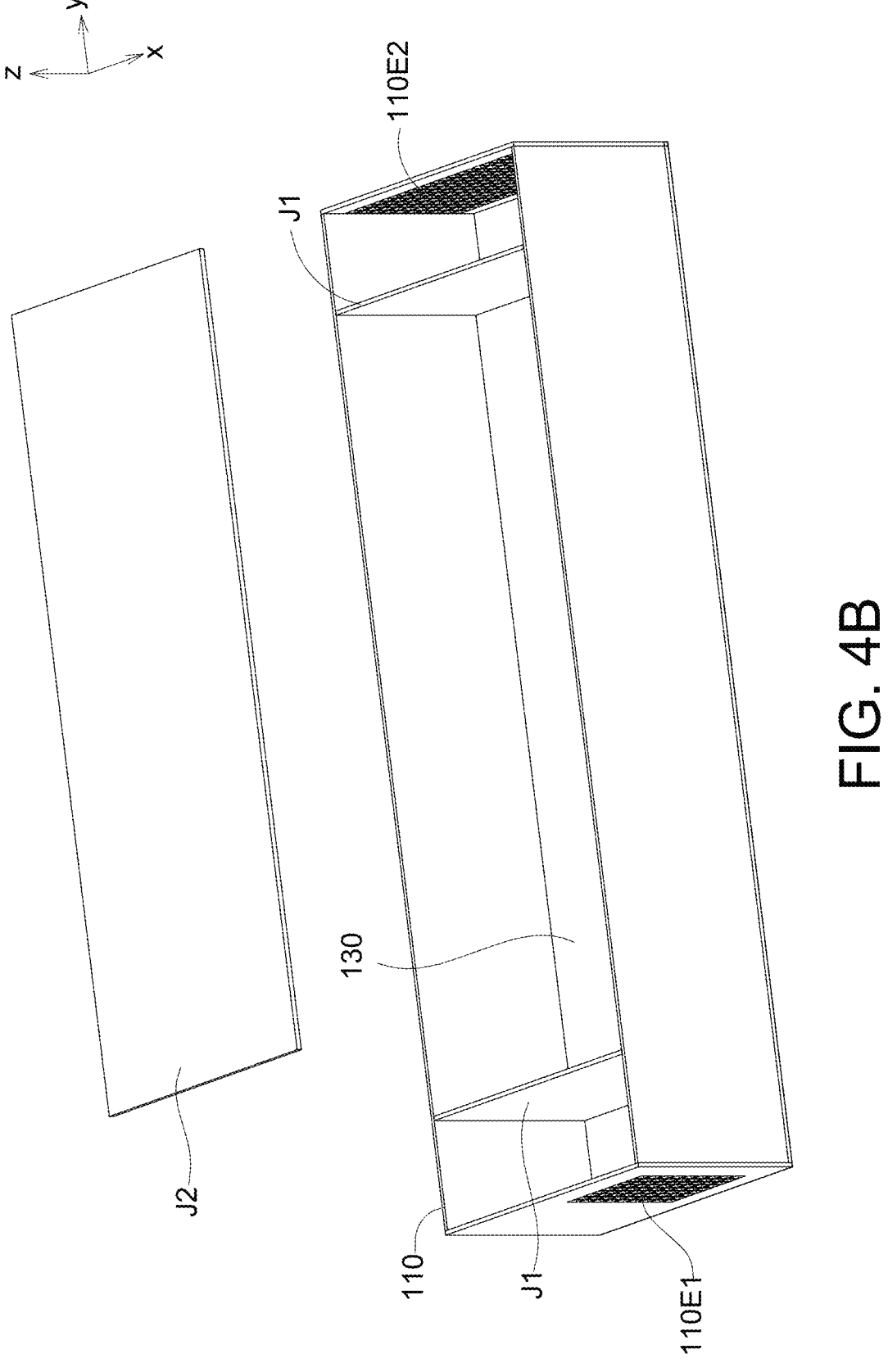
Figure 4C:
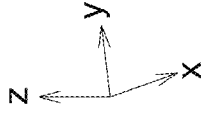
Figure 4C:
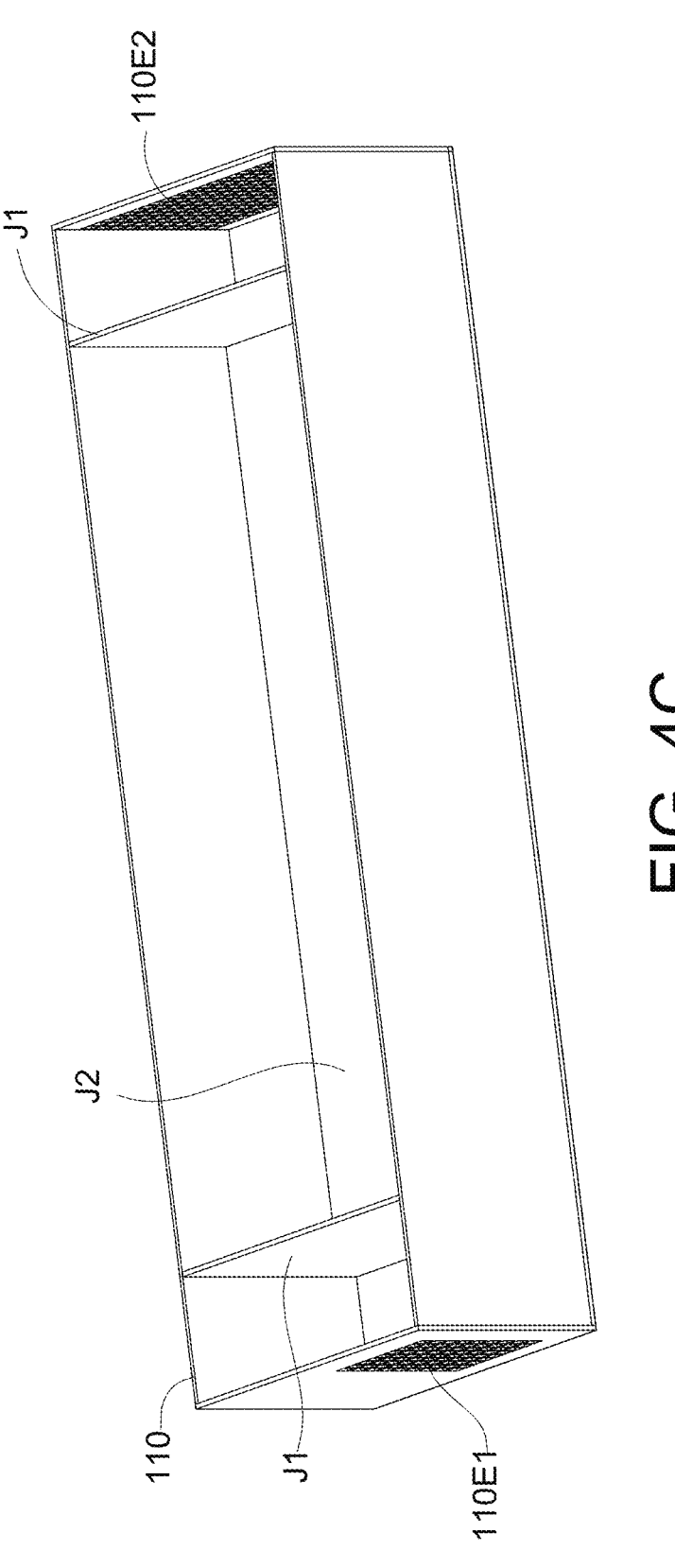
Figure 4D:
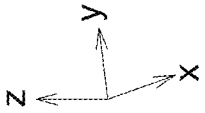
Figure 4D:
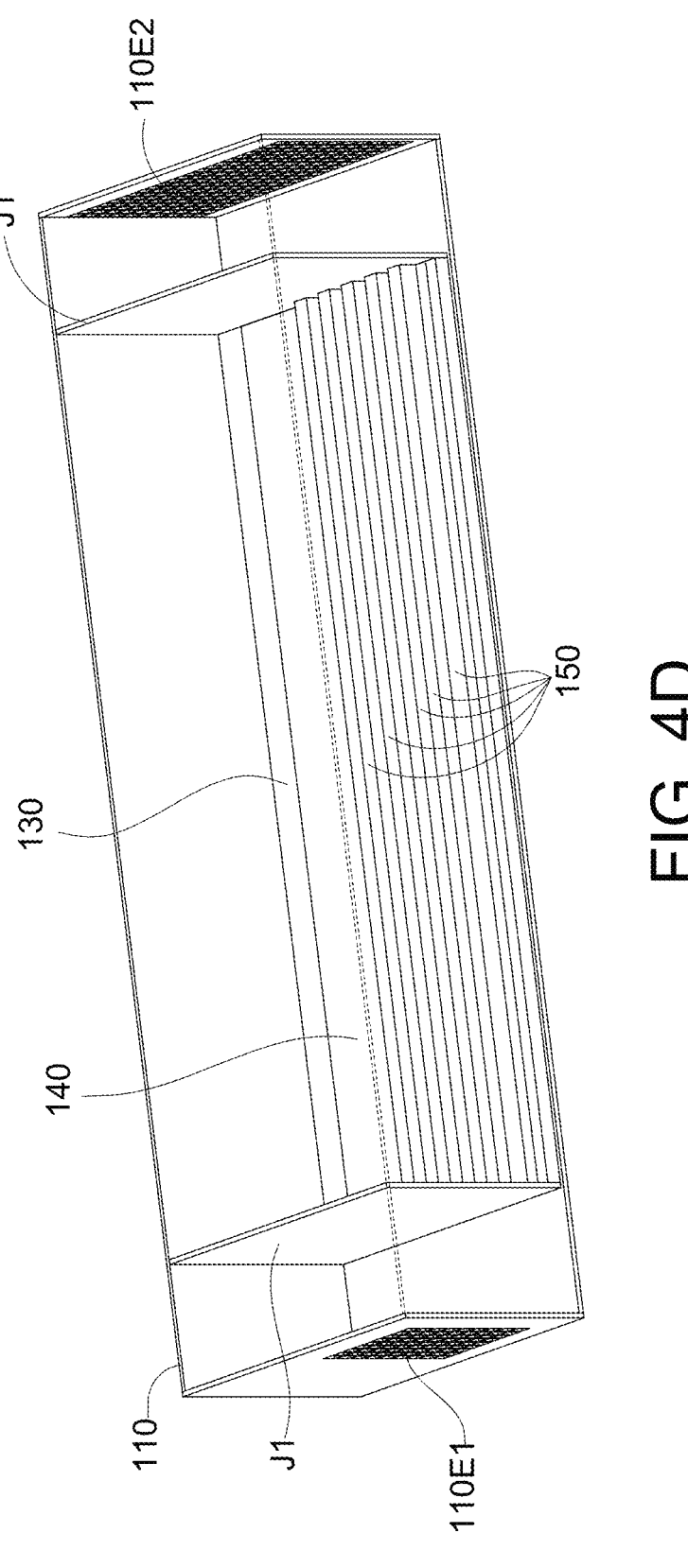
Figure 4E:
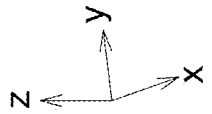
Figure 4E:
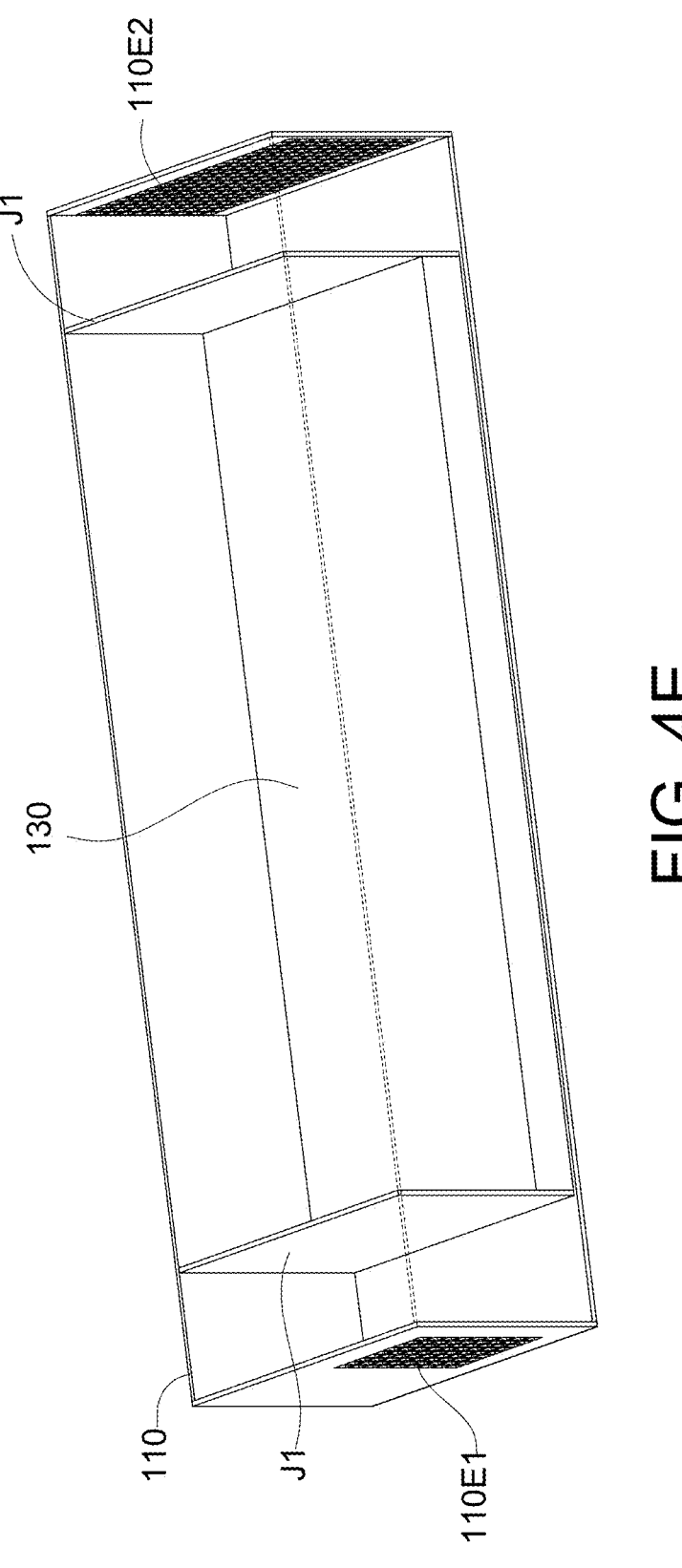
Figure 4F:
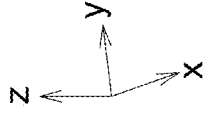
Figure 4F:
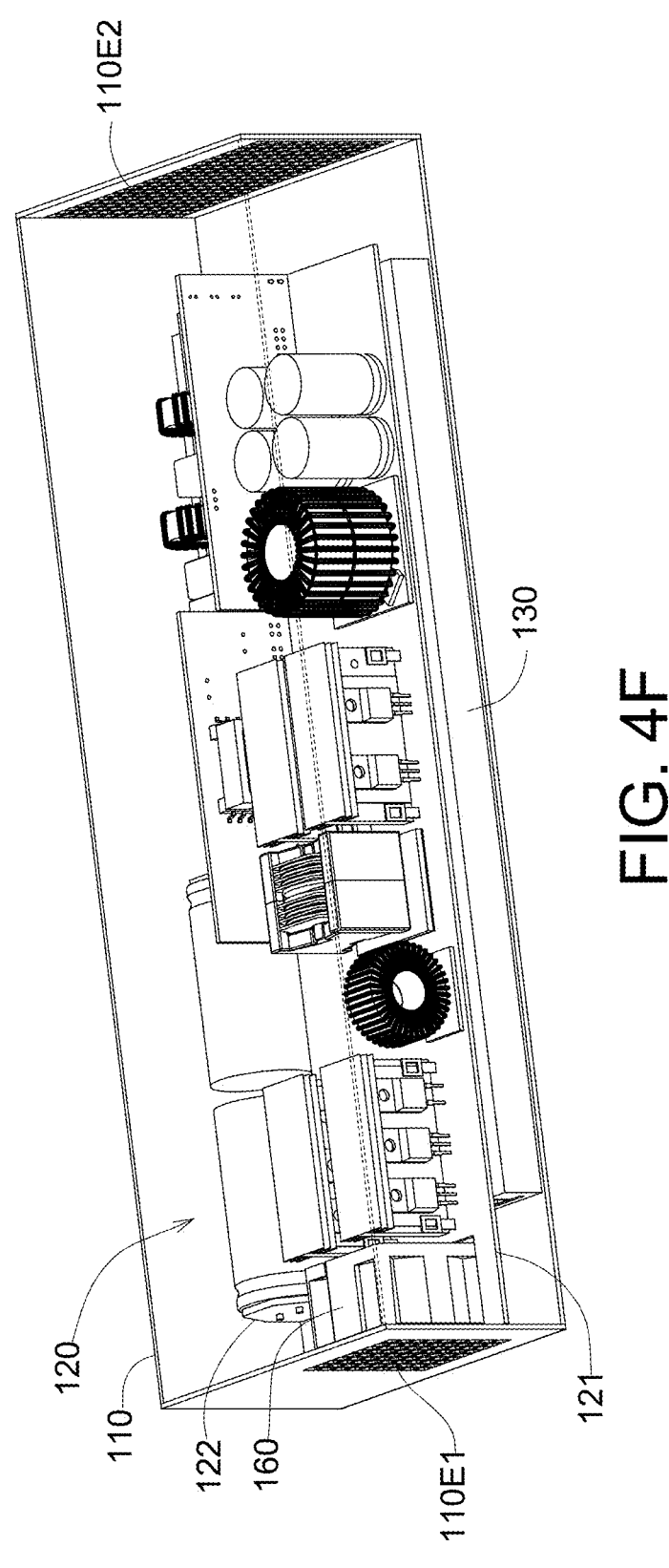

Firstly, as shown in FIG. 4A, a top wall 110T of the casing 110 is removed, and two jigs J1 are disposed inside the casing 110, with each jig J1 disposed adjacent to the inlet 110E1 and the outlet 110E2 of the casing 110, respectively. Then, thermally conductive glue 130 is poured in to fill the area defined by the casing 110 and the two jigs J1. Next, as shown in FIGS. 4B-4C, another jig J2 is laid above the thermally conductive glue 130 to let the thermally conductive glue 130 solidify with a fixed height. Then, as shown in FIG. 4D, the jig J2 is removed, and the thermally conductive plate 140 and a plurality of ventilation pipes 150 are disposed on the thermally conductive glue 130. In this embodiment, the thermally conductive plate 140 is first disposed, followed by the arrangement of the ventilation pipes 150 above the thermally conductive plate 140. Next, as shown in FIG. 4E, thermally conductive glue 130 is poured again until the thermally conductive plate 140 and the ventilation pipes 150 are completely covered, so that the thermally conductive plate 140 and the ventilation pipes 150 are embedded in the thermally conductive glue 130. Due to using the front and rear jigs J1, it ensures that the thermally conductive glue 130 does not flow into the openings OP of the ventilation pipes 150, thus maintaining unobstructed airflow channels in the ventilation pipes 150. Finally, as shown in FIG. 4F, the jigs J1 are removed, and the circuit board module 120 is disposed on the thermally conductive glue 130, followed by the installation of the fan module 160 into the casing 110, and the top wall 110T of the casing 110 is assembled back into place, resulting in a finished state of the power supply device 100 as shown in FIG. 1.

As described above, the present disclosure provides a new power supply device, which can enhance the heat dissipation for the pins of through-hole mounted electronic components by arranging thermally conductive glue as well as thermally conductive plate and ventilation pipes embedded therein and further setting a fan module to provide forced convection. Thus, compared with conventional heat dissipation configurations, the present disclosure can further improve the heat dissipation efficiency of the power supply device and effectively reduce the temperature of electronic components.

It will be apparent to those skilled in the art that various modifications and variations may be made to the disclosed embodiments. It is intended that the specification and examples be considered as exemplars only, with a true scope of the disclosure being indicated by the following claims and their equivalents.

What is claimed is:

1. A power supply device, comprising:
   a casing;
   a circuit board module, arranged in the casing;
   thermally conductive glue, disposed on the circuit board module and filled in a bottom of the casing;
   a thermally conductive plate, disposed on the circuit board module and is embedded in the thermally conductive glue; and
   a plurality of ventilation pipes, in contact with the thermally conductive plate and embedded in the thermally conductive glue, wherein each of the ventilation pipes has openings at two ends thereof.

2. The power supply device of claim 1, further comprising:
   a fan module, disposed in the casing and positioned in front of the ventilation pipes.

3. The power supply device of claim 2, wherein the fan module is configured to generate airflow passing the ventilation pipes through the openings, thereby taking away heat from the ventilation pipes.

4. The power supply device of claim 1, wherein the ventilation pipes are spaced apart and disposed above the thermally conductive plate.

5. The power supply device of claim 1, wherein the ventilation pipes are spaced apart and disposed below the thermally conductive plate.

6. The power supply device of claim 1, wherein the circuit board module comprises a circuit board, and there is a distance between the ventilation pipes and the circuit board.

7. The power supply device of claim 1, wherein there is a distance between the thermally conductive plate and a bottom wall of the casing.

8. The power supply device of claim 1, wherein there is a space between the thermally conductive glue and a front wall of the casing, and there is another space between the thermally conductive glue and a rear wall of the casing.

9. The power supply device of claim 1, wherein the circuit board module comprises a circuit board, and the thermally conductive glue is disposed below the circuit board; in a side view, a length of the circuit board is greater than a length of the thermally conductive glue.

10. The power supply device of claim 1, wherein the circuit board module comprises an electronic component and a circuit board, the electronic component is mounted on the circuit board with a through-hole insertion, and pins of the electronic component inserted into the circuit board are embedded in the thermally conductive glue.

11. The power supply device of claim 10, wherein the thermally conductive glue absorbs heat from the electronic component through contact with the pins of the electronic component, and then transfers the heat to the ventilation pipes.

12. The power supply device of claim 11, wherein the thermally conductive plate absorbs heat from the thermally conductive glue, and then transfers the heat to the ventilation pipes.

13. The power supply device of claim 1, wherein the thermally conductive glue is selected from organic silicone grease encapsulant, epoxy resin encapsulant, or polyurethane encapsulant.

14. The power supply device of claim 1, wherein the thermally conductive plate is formed of metal material.

15. The power supply device of claim 1, wherein the casing has an inlet and an outlet, and the inlet and the outlet are respectively positioned on a front side and a rear side of the casing.

16. The power supply device of claim 15, further comprising:

a fan module, positioned adjacent to the inlet.

17. The power supply device of claim 16, wherein the fan module is configured to generate airflow passing the ventilation pipes through the openings, thereby taking away heat from the ventilation pipes.

* * * * *